United States Patent
Schmid et al.

(10) Patent No.: US 11,383,269 B2
(45) Date of Patent: Jul. 12, 2022

(54) CURVED MICROMACHINED ULTRASONIC TRANSDUCER MEMBRANES

(71) Applicant: BFLY Operations, Inc., Guilford, CT (US)

(72) Inventors: Gerard Schmid, Guilford, CT (US); Sharath Hosali, Austin, TX (US); James Beach, Austin, TX (US); Jaime Scott Zahorian, Guilford, CT (US); Sarp Satir, San Francisco, CA (US)

(73) Assignee: BFLY OPERATIONS, INC., Guilford, CT (US)

( * ) Notice: Subject to any disclaimer, the term of this patent is extended or adjusted under 35 U.S.C. 154(b) by 172 days.

(21) Appl. No.: 16/896,310

(22) Filed: Jun. 9, 2020

(65) Prior Publication Data
US 2020/0384503 A1    Dec. 10, 2020

Related U.S. Application Data

(60) Provisional application No. 62/859,634, filed on Jun. 10, 2019.

(51) Int. Cl.
*B06B 1/02* (2006.01)
*B81C 1/00* (2006.01)

(52) U.S. Cl.
CPC ........ *B06B 1/0292* (2013.01); *B81C 1/00158* (2013.01); *B81B 2201/0271* (2013.01); *B81B 2203/0127* (2013.01); *B81B 2203/0315* (2013.01); *B81C 2201/0104* (2013.01); *B81C 2201/0105* (2013.01)

(58) Field of Classification Search
CPC .................................................. B06B 1/0292
See application file for complete search history.

(56) References Cited

U.S. PATENT DOCUMENTS

| | | | |
|---|---|---|---|
| 6,430,109 B1 | 8/2002 | Khuri-Yakub et al. |
| 6,694,817 B2 | 2/2004 | Degertekin et al. |
| 6,958,255 B2 | 10/2005 | Khuri-Yakub et al. |
| 7,846,102 B2 | 12/2010 | Kupnik et al. |
| 8,402,831 B2 | 3/2013 | Kupnik et al. |
| 9,067,779 B1 | 6/2015 | Rothberg et al. |
| 9,242,275 B2 | 1/2016 | Rothberg et al. |
| 9,499,392 B2 | 11/2016 | Rothberg et al. |
| 9,505,030 B2 | 11/2016 | Rothberg et al. |
| 9,533,873 B2 | 1/2017 | Rothberg et al. |

(Continued)

FOREIGN PATENT DOCUMENTS

| | | |
|---|---|---|
| WO | WO 2013/005486 A1 | 1/2013 |
| WO | WO 2016/011000 A1 | 1/2016 |
| WO | WO 2017/222964 A1 | 12/2017 |

OTHER PUBLICATIONS

PCT/US2020/036735, Sep. 17, 2020, International Search Report and Written Opinion.

(Continued)

*Primary Examiner* — Moazzam Hossain
(74) *Attorney, Agent, or Firm* — Osha Bergman Watanabe & Burton LLP (57) ABSTRACT

A method of forming an ultrasonic transducer device includes forming a curved membrane over a transducer cavity. A center portion of the curved membrane is closer to a bottom surface of the transducer cavity than with respect to radially outwardly disposed portions of the curved membrane.

7 Claims, 11 Drawing Sheets

(56) References Cited

U.S. PATENT DOCUMENTS

| | | | |
|---|---|---|---|
| 9,987,661 | B2 | 6/2018 | Alie et al. |
| 10,196,261 | B2 | 2/2019 | Rothberg et al. |
| 10,272,471 | B2 | 4/2019 | Alie et al. |
| 10,446,132 | B2 | 10/2019 | Alie et al. |
| 10,497,856 | B2 | 12/2019 | Rothberg et al. |
| 10,672,974 | B2 | 6/2020 | Rothberg et al. |
| 2010/0207484 | A1* | 8/2010 | Chang .................. B06B 1/0292 310/300 |
| 2010/0225200 | A1 | 9/2010 | Kupnik et al. |
| 2010/0244162 | A1 | 9/2010 | Laming et al. |
| 2011/0055447 | A1 | 3/2011 | Costa |
| 2011/0316100 | A1 | 12/2011 | Kim et al. |
| 2012/0010538 | A1 | 1/2012 | Dirksen |
| 2013/0210175 | A1 | 8/2013 | Hoisington et al. |
| 2014/0192397 | A1 | 7/2014 | Atnip |
| 2015/0194320 | A1* | 7/2015 | Allen ................ H01L 21/02164 438/699 |
| 2017/0215846 | A1 | 8/2017 | Sammoura et al. |
| 2017/0360397 | A1 | 12/2017 | Rothberg et al. |
| 2017/0360399 | A1 | 12/2017 | Rothberg et al. |
| 2017/0360405 | A1 | 12/2017 | Rothberg et al. |
| 2017/0360413 | A1 | 12/2017 | Rothberg et al. |
| 2017/0360414 | A1 | 12/2017 | Rothberg et al. |
| 2017/0360415 | A1 | 12/2017 | Rothberg et al. |
| 2018/0186628 | A1 | 7/2018 | Rothberg et al. |
| 2018/0369862 | A1 | 12/2018 | Alie et al. |
| 2019/0000418 | A1 | 1/2019 | Rothberg et al. |
| 2019/0000422 | A1 | 1/2019 | West et al. |
| 2019/0001159 | A1 | 1/2019 | Chen et al. |
| 2019/0047850 | A1 | 2/2019 | Rothberg et al. |
| 2019/0069842 | A1 | 3/2019 | Rothberg et al. |
| 2019/0362698 | A1 | 11/2019 | Alie et al. |
| 2019/0366382 | A1* | 12/2019 | Akiyama .............. B06B 1/0215 |
| 2020/0066966 | A1 | 2/2020 | Rothberg et al. |
| 2020/0093463 | A1 | 3/2020 | Sam et al. |
| 2020/0163654 | A1 | 5/2020 | Satir et al. |
| 2020/0222940 | A1* | 7/2020 | Kawano ................ B06B 1/0292 |
| 2020/0324318 | A1* | 10/2020 | Liu .................... G01N 29/2406 |
| 2021/0307172 | A1* | 9/2021 | Darmawikarta ..... H05K 3/4697 |

OTHER PUBLICATIONS

Daft et al., Microfabricated Ultrasonic Transducers Monolithically Integrated with High Voltage Electronics. Proc Ultrason Symp. 2004;493-6.

Gurun et al., Front-end CMOS Electronics for Monolithic Integration with CMUT Arrays: Circuit Design and Initial Experimental Results. Proc Ultrason Symp. 2008;390-3.

Kupnik et al., CMUT Fabrication Based on a Thick Buried Oxide Layer. Proc IEEE Ultrason Symp. Oct. 2010;2010:547-550. doi:10.1109/ULTSYM.2010.5935935. Epub Jun. 8, 2012. 10 pages.

Kupnik et al., Wafer-Bonded CMUT Meets CMOS. 2010 CMOS Emerging Technology Workshop. May 21, 2010;1-22.

International Search Report and Written Opinion dated Sep. 17, 2020 in connection with International Application No. PCT/US2020/036735.

Kalra, Advanced Source/Drain Technologies for Nanoscale CMOS. Dissertation submitted for Ph.D Engineering—Electrical engineering and Computer Sciences. Univ California Berkeley. 2008; 46 pages.

* cited by examiner

CURVED MICROMACHINED ULTRASONIC TRANSDUCER MEMBRANES

CROSS-REFERENCE TO RELATED APPLICATIONS

The present application claims the benefit under 35 U.S.C. § 119(e) of U.S. Patent Application Ser. No. 62/859,634, filed Jun. 10, 2019 and entitled "CURVED MICROMACHINED ULTRASONIC TRANSDUCER MEMBRANES," which is hereby incorporated by reference herein in its entirety.

BACKGROUND

The present disclosure relates generally to micromachined ultrasonic transducers and, more specifically, to fabrication techniques and associated structures for forming curved transducer membranes for micromachined ultrasound devices.

Ultrasound devices may be used to perform diagnostic imaging and/or treatment, using sound waves with frequencies that are higher with respect to those audible to humans. Ultrasound imaging may be used to see internal soft tissue body structures, for example to find a source of disease or to exclude any pathology. When pulses of ultrasound are transmitted into tissue (e.g., by using a probe), sound waves are reflected off the tissue with different tissues reflecting varying degrees of sound. These reflected sound waves may then be recorded and displayed as an ultrasound image to the operator. The strength (amplitude) of the sound signal and the time it takes for the wave to travel through the body provide information used to produce the ultrasound images.

Some ultrasound imaging devices may be fabricated using micromachined ultrasonic transducers, including a flexible membrane suspended above a substrate. A cavity is located between part of the substrate and the membrane, such that the combination of the substrate, cavity and membrane form a variable capacitor. When actuated by an appropriate electrical signal, the membrane generates an ultrasound signal by vibration. In response to receiving an ultrasound signal, the membrane is caused to vibrate and, as a result, generates an output electrical signal.

SUMMARY

In one aspect, a method of forming an ultrasonic transducer device includes forming a curved membrane over a transducer cavity. A center portion of the curved membrane is closer to a bottom surface of the transducer cavity than with respect to radially outwardly disposed portions of the curved membrane. The method may include forming a curved sacrificial cavity material over a transducer bottom electrode, forming one or more membrane layers over the curved sacrificial cavity material and the transducer bottom electrode and removing the sacrificial cavity material.

In another aspect, the method may include forming a sacrificial cavity material over a transducer bottom electrode; forming one or more membrane layers over the sacrificial cavity material and the transducer bottom electrode, wherein at least one of the one or more membrane layers is formed as a tensile layer; and removing the sacrificial cavity material, such that the at least one of the one or more tensile membrane layers results in the curved membrane.

In another aspect, the method may include forming transducer cavities on a CMOS wafer; bonding a membrane wafer to the CMOS wafer to seal the transducer cavities; and performing an anneal to induce a curvature in the membrane wafer.

In another aspect, an ultrasonic transducer device includes a curved membrane formed over a transducer cavity. A center portion of the curved membrane is closer to a bottom surface of the transducer cavity than with respect to radially outwardly disposed portions of the curved membrane.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 1-1 through 1-9 are a series of cross-sectional views illustrating an exemplary process flow for forming a micromachined ultrasound transducer device.

FIGS. 2-1 through 2-9 are a series of cross-sectional views illustrating an exemplary process flow for forming a micromachined ultrasound transducer device having a curved membrane according to an embodiment.

FIGS. 3-1 through 3-3 are a series of cross-sectional views illustrating an exemplary process flow for an alternate embodiment of a portion of the process flow of FIGS. 2-1 through 2-9.

FIGS. 4-1 through 4-7 are a series of cross-sectional views illustrating an exemplary process flow for forming a micromachined ultrasound transducer device having a curved membrane according to another embodiment.

DETAILED DESCRIPTION

The techniques described herein relate to forming curved transducer membranes for micromachined ultrasound devices. Embodiments described herein provide a number of approaches for fabrication such curved transducer membranes including, for example: forming a curved profile in a sacrificial cavity material, which profile is adopted by subsequent membrane layer(s) formed on the sacrificial cavity material; utilizing film stress engineering to induce curvature by achieving a film stress gradient across the membrane thickness; and creating a pressure-induced curvature after the transducer cavity is sealed (e.g., by annealing at high pressure to fuse a collapsed cavity). The exemplary approaches are described in further detail herein.

One type of transducer suitable for use in ultrasound imaging devices is a micromachined ultrasound transducer (MUT), which can be fabricated from, for example, silicon and configured to transmit and receive ultrasound energy. MUTs may include capacitive micromachined ultrasound transducers (CMUTs) and piezoelectric micromachined ultrasound transducers (PMUTs), which can offer several advantages over more conventional transducer designs such as, for example, lower manufacturing costs and fabrication times and/or increased frequency bandwidth. With respect to the CMUT device, the basic structure is a parallel plate capacitor with a rigid bottom electrode and a top electrode residing on or within a flexible membrane. Thus, a cavity is defined between the bottom and top electrodes. In some designs (such as those produced by the assignee of the present application for example), the CMUT transducer may be formed directly integrated on an integrated circuit that controls the operation of the transducer. One way of manufacturing CMUT ultrasound device is to bond a membrane substrate to an integrated circuit substrate, such a CMOS substrate. This may be performed at temperatures sufficiently low enough to prevent damage to the devices of the integrated circuit.

Referring initially now to FIGS. 1-1 through 1-9 there is shown a series of cross-sectional views illustrating an exemplary process flow for forming a micromachined ultrasound transducer device. As shown in FIG. 1-1, a substrate (e.g., a complementary metal oxide semiconductor (CMOS) substrate, such as silicon) 100 has a passivation layer 102 and a patterned bottom electrode metal stack 104 formed thereon (hereinafter referred to as "bottom electrode"). The CMOS substrate 100 may include, but is not necessarily limited to, CMOS circuits, wiring layers, redistribution layers, and insulation/passivation layers (e.g., passivation layer 102, such as $SiO_2$). In an exemplary embodiment, the electrode metal stack 104 may include one or more individual metal layers such as, for example, aluminum (Al), titanium (Ti), titanium nitride (TiN), tantalum (Ta), tantalum nitride (TaN), copper (Cu), AlCu, and alloys thereof. The electrode metal stack 104 may be formed by subtractive processes (e.g., blanket metal deposition and etching) or by damascene processes (e.g., insulation layer patterning followed by metal fill and planarization).

Figure 12:
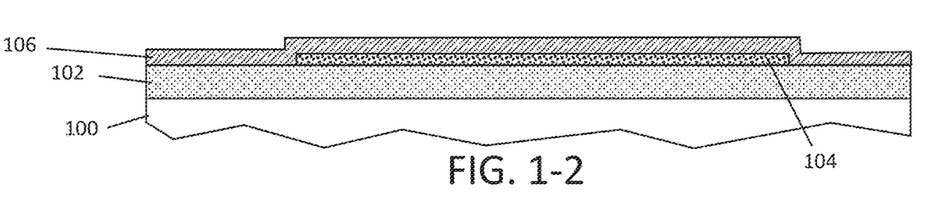
Figure 13:
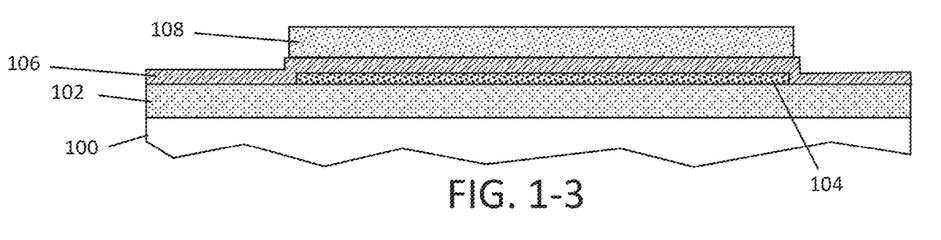
Figure 14:
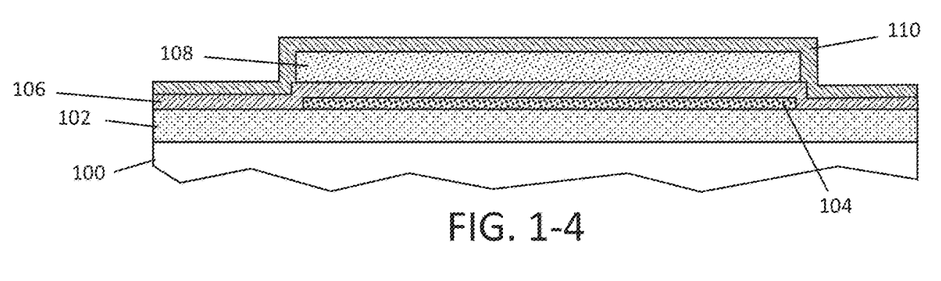
Figure 15:
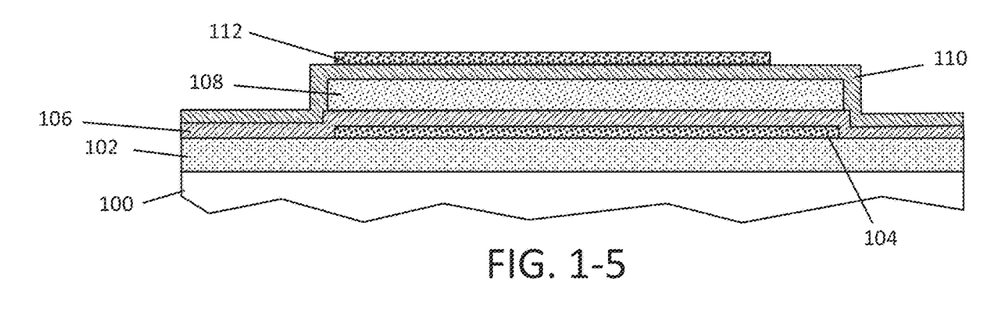
Figure 16:
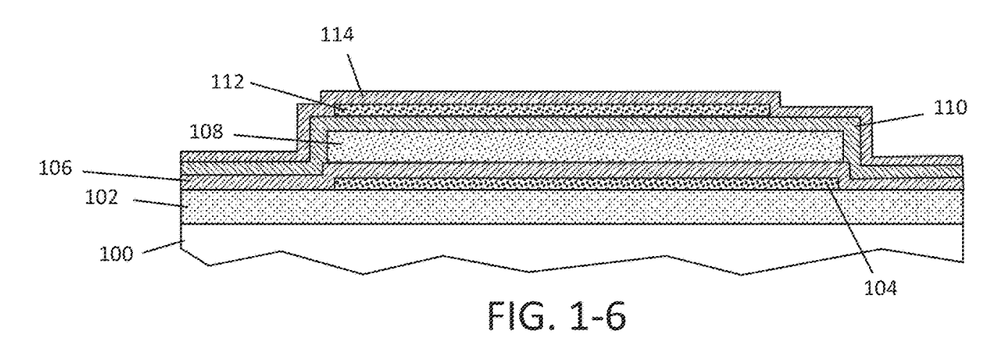
Figure 17:
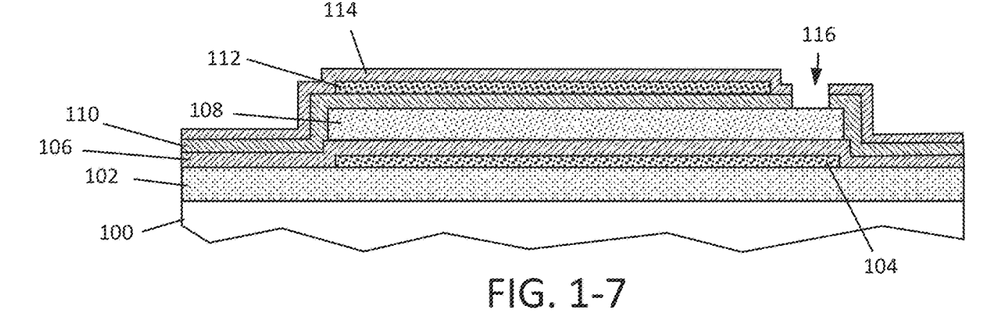

As shown in FIG. 1-2, a first dielectric layer 106 is formed over the passivation layer 102 and patterned bottom electrode 104. In embodiments, the first dielectric layer 106 may be a high dielectric constant (high-k) layer such as silicon nitride (SiN), silicon oxynitride (SiON), halfnium oxide ($HfO_2$), etc. formed at thickness of about 10-100 nanometers (nm). However, other dielectric materials such as oxides of aluminum, zirconium, and/or tantalum may also be used. Where a nitride based dielectric is used for layer 106, there may be some topography associated with the layer as shown in FIG. 1-2. In such a case, the topography may remain or, alternatively, may be planarized to the top of the bottom electrode 104. Optionally, the first dielectric layer 106 may be formed as a bi-layer if desired in order to, for example, provide additional protection for electrode structures from subsequently introduced cavity release etchant materials.

A sacrificial cavity material 108 may then be formed over the structure of FIG. 1-2 and lithographically patterned and etched, resulting in the structure illustrated in FIG. 1-3. The sacrificial cavity material 108 may include one or more layers of a material or materials such as, for example, Al, Cu, chromium (Cr), Si, tungsten (W), TiN or alloys thereof, formed at a thickness of about 200 nm. As shown in FIG. 1-4, a second dielectric layer 110 is formed over the first dielectric layer 106 and sacrificial cavity material 108. The second dielectric layer 110 may be formed from the same material and at the same thickness as the first dielectric layer 106. Then, as shown in FIG. 1-5, a patterned top electrode 112 is formed over the second dielectric layer 110. The top electrode 112 may be formed from the same material(s) as the bottom electrode 104 and, optionally, at the same or different thickness (e.g., thinner) than the bottom electrode 104. In addition, a patterned width of the top electrode 112 may be smaller than the bottom electrode 104 (e.g., as shown at the top right portion of FIG. 1-5), or otherwise designed so as to allow access to the sacrificial cavity material 108 for subsequent removal thereof.

Referring now to FIG. 1-6, a third dielectric layer 114 is formed over the second dielectric layer 110 and top electrode 112. The third dielectric layer 114 may be formed from the same material(s) as the first and second dielectric layers 106, 110 and, optionally, at a greater thickness the first and second dielectric layers 106, 110 (e.g., 1000 nm). As shown in FIG. 1-7, an access hole 116 is formed through the third and second dielectric layer 114, 110, such as by etching for example, to expose a portion of the sacrificial cavity material 108. In FIG. 1-8, the sacrificial cavity material 108 is etched to create an ultrasound transducer cavity 118. Then, as shown in FIG. 1-9, a fourth dielectric layer 120 is formed over the structure to seal the cavity 118. The fourth dielectric layer 120 may be formed from the same material as one or more of the previously formed dielectric layers, and at a greater thickness (e.g., about 5000 nm). From this point, additional processing may continue to complete the fabrication of an operational ultrasound transducer array, the details of which are beyond the scope of the present disclosure.

Figure 19:
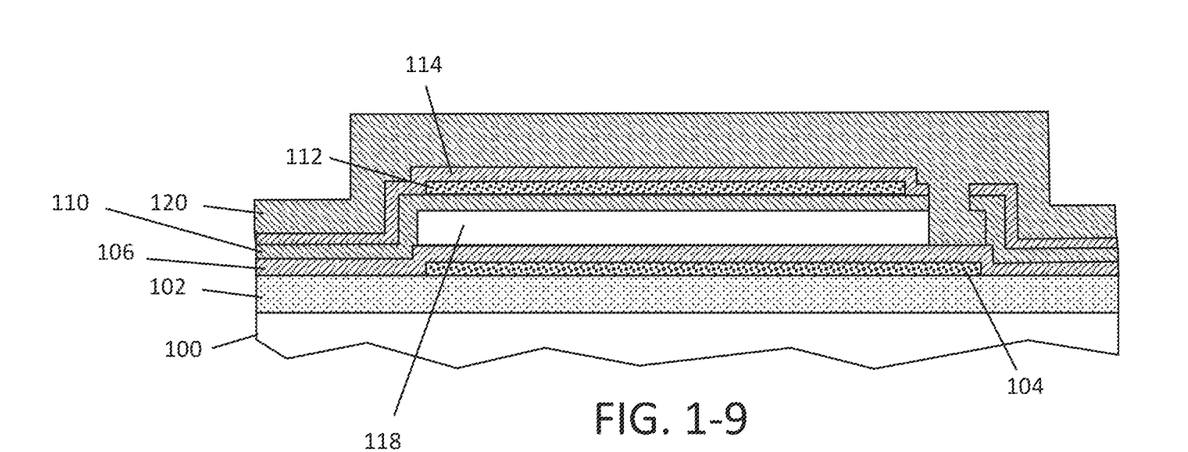
Figure 21:
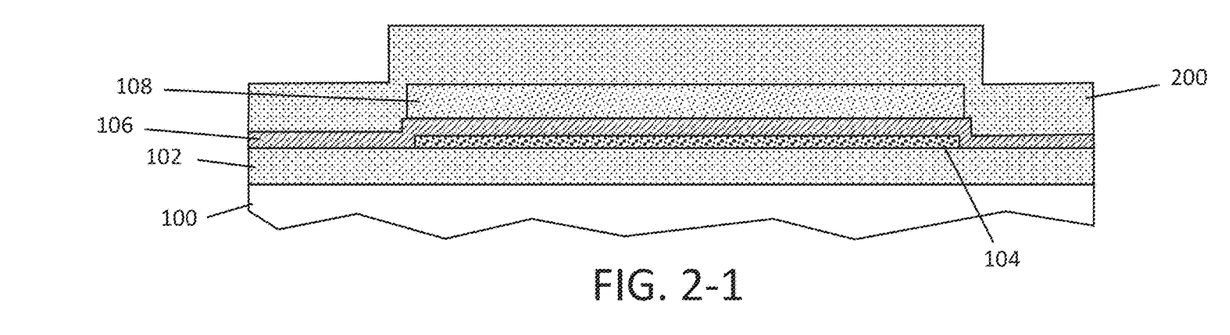
Figure 22:
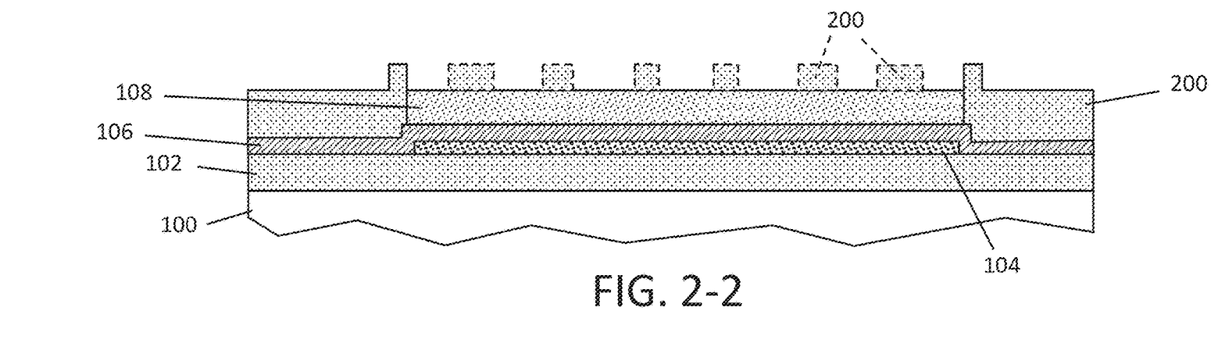
Figure 23:
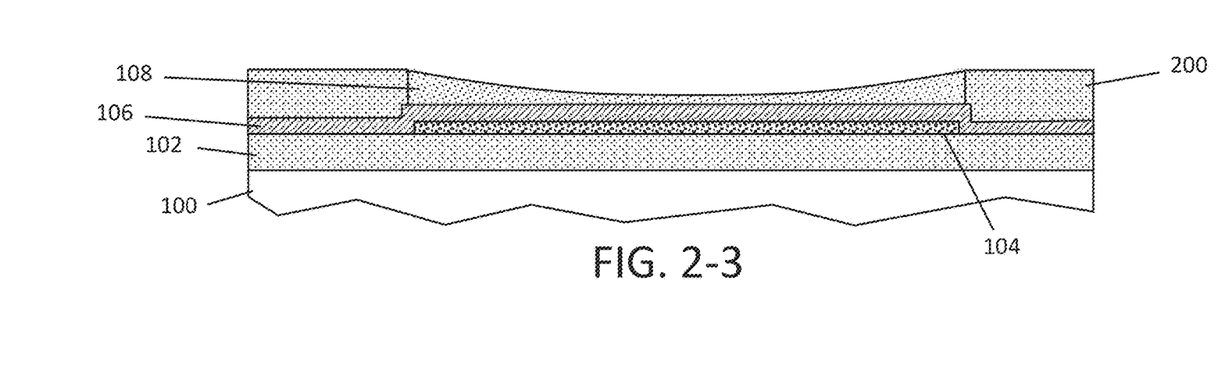

During operation of a micromachined ultrasound transducer device such as shown in FIG. 1-9, whether in a transmit mode and/or a receive mode, the transducer membrane (e.g., second dielectric layer 110) may come into physical contact with the bottom surface of the cavity 118 (e.g., the first dielectric layer 106). This position may be indicative of the so-called "collapse mode" of operation as known in the art. A "collapse mode" (also used interchangeably with the term "collapsed mode") refers to a mode of transducer operation in which at least one portion of a micromachined ultrasonic transducer membrane is mechanically fixed and at least one portion of the membrane is free to vibrate based on a changing voltage differential between the electrode and the membrane. One possible advantage to operating a micromachined ultrasonic transducer in collapse mode may be optimize the acoustic power (output pressure) produced by the transducer. However, in order to bring the transducer into collapse mode, a sufficient DC bias voltage is needed such that, the greater the initial distance between the membrane and the bottom of the transducer cavity, the higher the DC bias voltage needed.

Referring generally now to FIGS. 2-1 through 2-9, there is shown are a series of cross-sectional views illustrating an exemplary process flow for forming a micromachined ultrasound transducer device having a curved membrane according to an embodiment. For ease of illustration, like elements and structures are designated with like naming conventions and reference numbers throughout the embodiments. In this exemplary embodiment, chemical mechanical planarization/polishing (CMP) removal rates are advantageously utilized to engineer a controlled surface topography in the sacrificial cavity material. This surface topography of the sacrificial cavity material in turn determines the curvature of a membrane subsequently deposited thereon. With respect to the embodiment described above, FIG. 2-1 illustrates a point in processing after patterning of the sacrificial cavity material 108 (e.g., as was shown in FIG. 1-3). However, rather than depositing a relatively thin second dielectric layer (e.g., layer 110 shown in FIG. 1-4), FIG. 2-1 additionally illustrates the formation of a relatively thick CMP support dielectric layer 200 over the first dielectric layer 106 and sacrificial cavity material 108. In an embodiment, the CMP support dielectric layer 200 may be the same material as the first dielectric layer 106, but formed at a greater thickness (e.g., 1000 nm or more).

In FIG. 2-2, the CMP support dielectric layer 200 is patterned as illustrated in preparation for a CMP operation on the sacrificial cavity material 108. In one embodiment, the CMP support dielectric layer 200 may be patterned so as to be completely removed directly above the sacrificial cavity material 108. Alternatively, selected portions (indicted by dashes in FIG. 2-1) of the CMP support dielectric layer 200 may remain over the sacrificial cavity material 108 after patterning. With either approach, it is desirable to pattern the sacrificial cavity material 108 in a manner that promotes dishing of the sacrificial cavity material 108 after a CMP operation, as shown in FIG. 2-3. As can be seen, the CMP operation results in the sacrificial cavity material 108 becoming concave in shape (i.e., being thinner at a central region and thicker at outer regions adjacent the CMP support dielectric layer 200). It should be noted that the use of a bilayer stack for the sacrificial cavity material 108 can assist in robust stopping of the CMP at a certain thickness of the sacrificial material, while the dishing is confined only to the top layer. From this point, similar steps may be performed as was previously described with respect to FIGS. 1-4 through 1-9, but with different structural results owning to the concave shape of the sacrificial cavity material 108.

Figure 24:
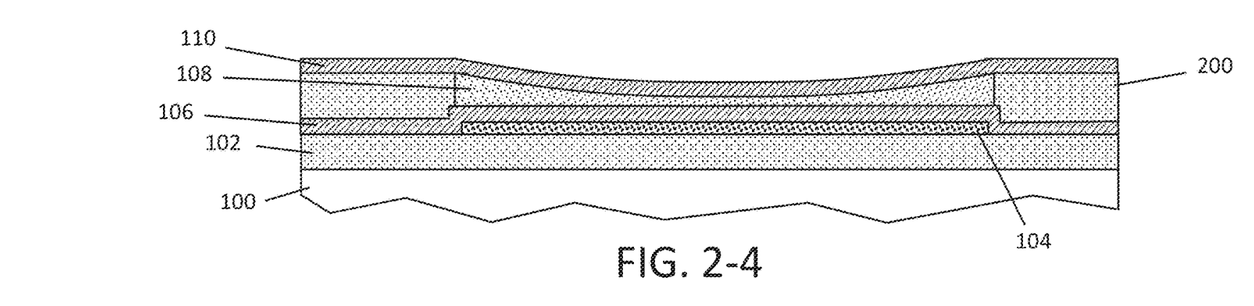
Figure 25:
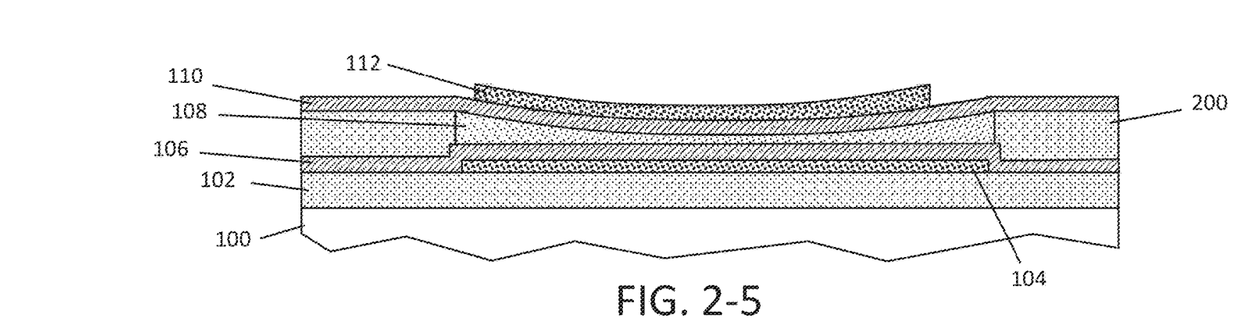
Figure 26:
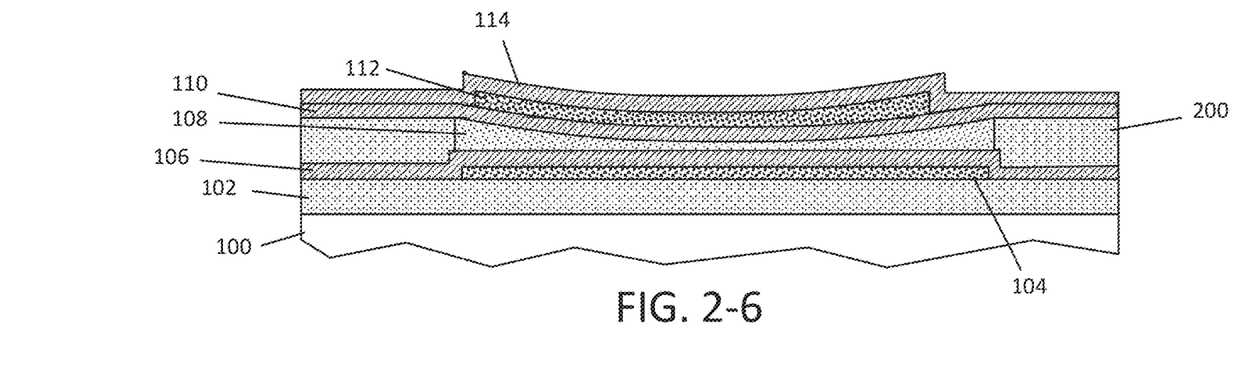
Figure 27:
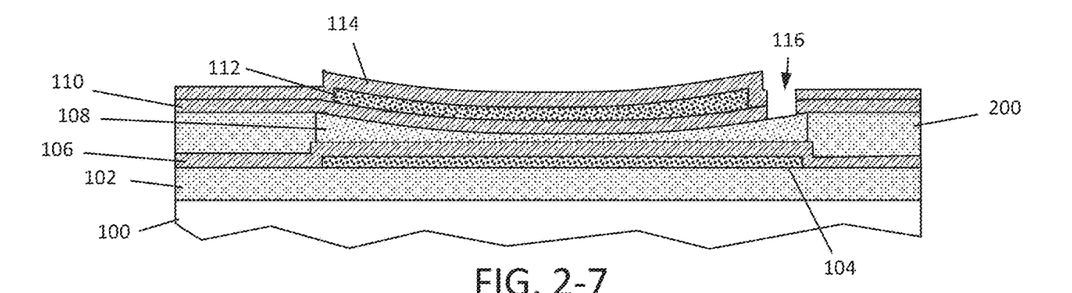
Figure 28:
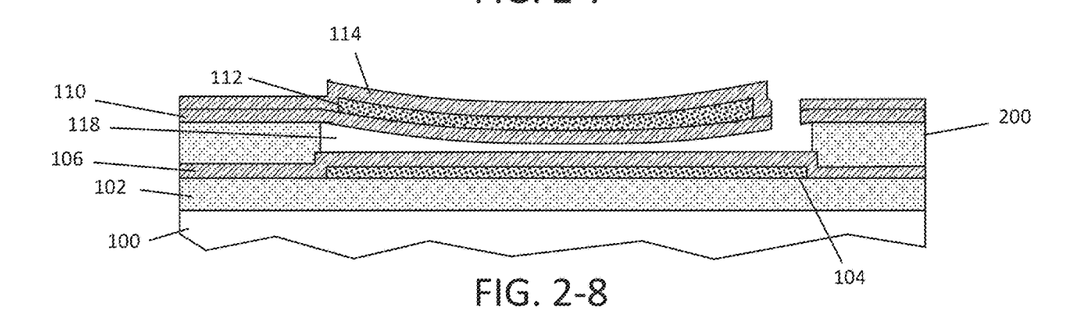

For example, as next shown in FIG. 2-4, a second dielectric layer 110 is formed over the CMP support dielectric layer 200 and sacrificial cavity material 108. The second dielectric layer 110 may be formed from a same material and at a same thickness as the first dielectric 106 and, notably, is conformal with the concave shape of the sacrificial cavity material 108. Then, as shown in FIG. 2-5, a patterned top electrode 112 is formed over the second dielectric layer 110. The top electrode 112 may be formed from the same material(s) as the bottom electrode 104 and, optionally, at the same or different thickness (e.g., thinner) than the bottom electrode 104. In addition, a patterned width of the top electrode 112 may be smaller than the bottom electrode 104 (e.g., as shown at the top right portion of FIG. 2-5) so as to allow access to the sacrificial cavity material 108 for subsequent removal thereof.

Referring now to FIG. 2-6, a third dielectric layer 114 is formed over the second dielectric layer 110 and top electrode 112. The third dielectric layer 114 may be formed from the same material(s) as the first and second dielectric layers 106, 110 and, optionally, at a greater thickness the first and second dielectric layers 106, 110 (e.g., 1000 nm). As shown in FIG. 2-7, an access hole 116 is formed through the third and second dielectric layer 114, 110, such as by etching for example, to expose a portion of the sacrificial cavity material 108. In FIG. 2-8, the sacrificial cavity material 108 is etched to create an ultrasound transducer cavity 118. Then, as shown in FIG. 2-9, a fourth dielectric layer 120 is formed over the structure to seal the cavity 118. The fourth dielectric layer 120 may be formed from the same material as one or more of the previously formed dielectric layers, and at a greater thickness (e.g., about 5000 nm).

Figure 29:
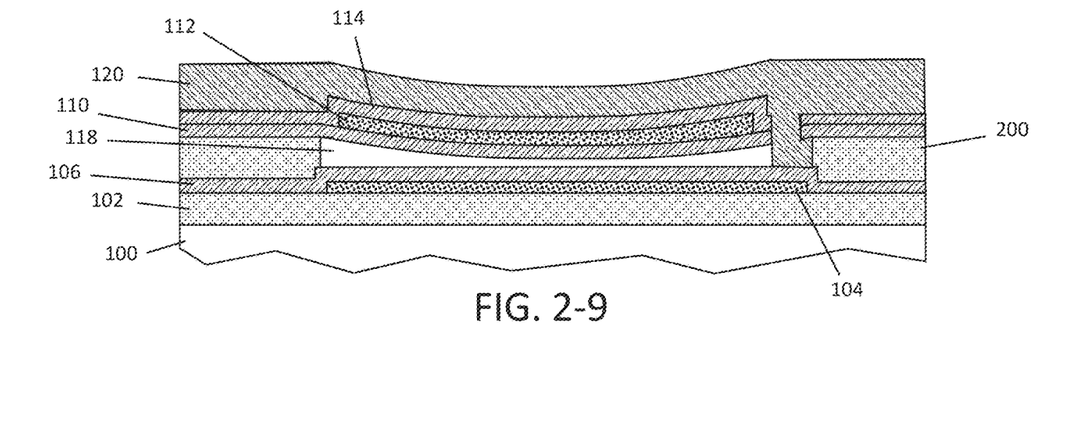

A possible advantage of the structure illustrated in FIG. 2-9 is improved transducer performance due to (for example) a reduction in voltage required for membrane collapse, in that the region of the second dielectric layer 110 corresponding to the center of the transducer cavity 118 is physically closer to the first dielectric layer 106 as compared to the embodiment of FIG. 1-9. Accordingly, a smaller voltage may bring the transducer into collapse such that the second dielectric layer 110 is in physical contact with the first dielectric layer 106 during transducer operation.

In addition to utilizing a CMP operation to provide a curved profile sacrificial layer structure, other techniques are also contemplated. For example, FIGS. 3-1 through 3-3 are a series of cross-sectional views illustrating an exemplary process flow for an alternate embodiment of a portion of the process flow of FIGS. 2-1 through 2-9. In this exemplary embodiment, grayscale lithography is used to create a 3D topography in a patterned resist material, which 3D topography is in turn transferred into a sacrificial material. Similar to the previous embodiment, the surface topography of the sacrificial material determines the curvature of subsequent layers (e.g., a membrane) deposited on the sacrificial material, where the curvature remains after removal of the sacrificial material.

Figure 31:
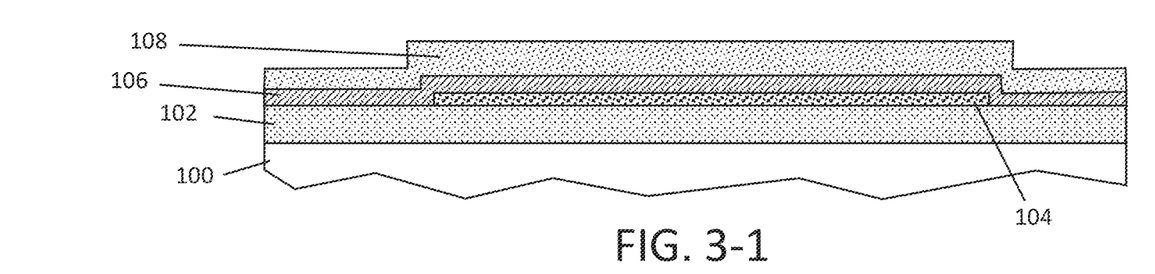
Figure 32:
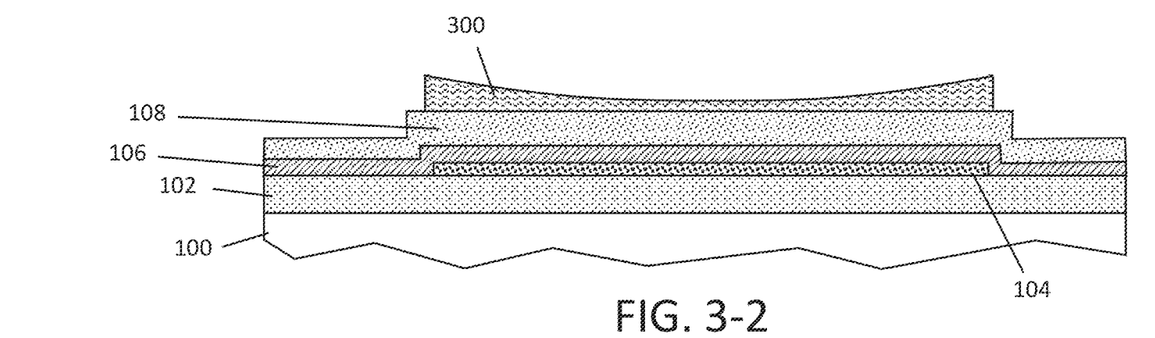

As illustrated in FIG. 3-1, a sacrificial cavity material layer 108 is formed over a first dielectric layer 106, patterned bottom electrode 104, passivation layer 102 and CMOS substrate 100. The layers in FIG. 3-1 may be substantially similar to those depicted in the previously described embodiments. Then, as shown in FIG. 3-2, a photoresist layer 300 is formed over the sacrificial cavity material layer 108 and patterned in the manner depicted to result in a concave structure. Again, this may be accomplished via grayscale lithography, for example, which spatially modulates ultraviolet (UV) dosage of the resist material, thereby varying the depth at which the resist material is developed.

Figure 33:
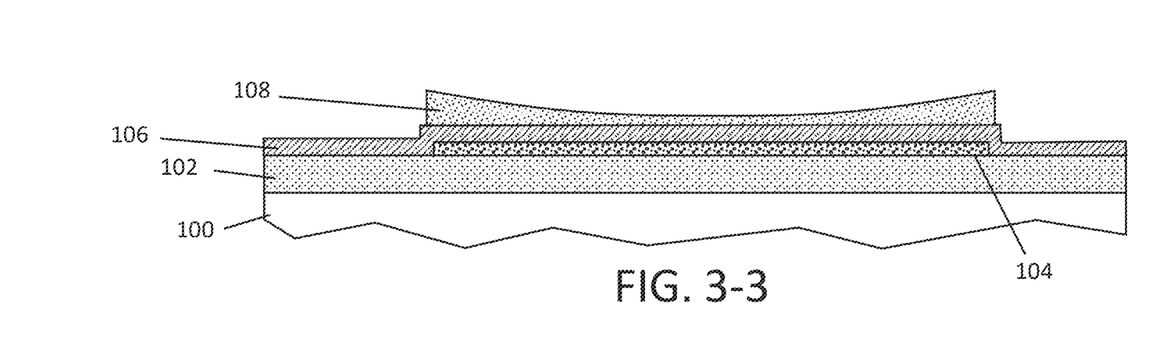
Figure 41:
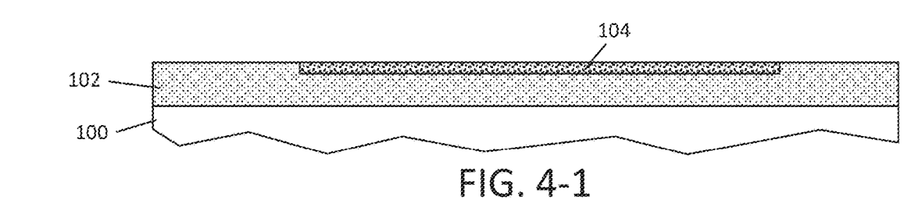
Figure 42:
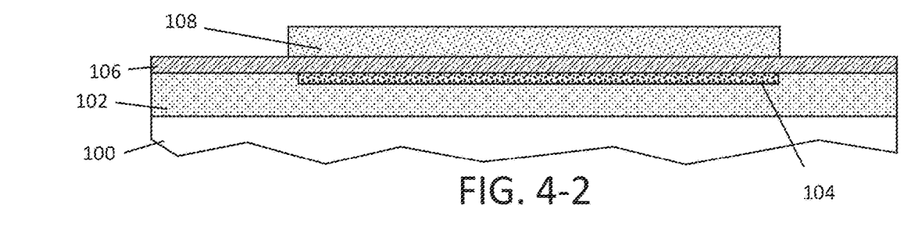

Following grayscale patterning of the photoresist layer 300, the resulting pattern may then be transferred into the sacrificial cavity material layer 108, such as by plasma etching for example, to result in the structure illustrated in FIG. 3-3. An etch recipe may be tuned for low etch selectivity between the resist material and the etched sacrificial cavity material in order to transfer the concave pattern into the sacrificial cavity material layer 108. In other embodiments, the sacrificial cavity material layer 108 may be shaped by first performing the grayscale lithography to create the concave regions in the sacrificial cavity material layer 108 corresponding to the cavity regions, followed by using standard lithography to remove the sacrificial cavity material layer material everywhere else. The reverse may also be performed (standard lithography followed by grayscale lithography). It may be advantageous to divide up the processing into separate grayscale and standard pattering due to the complexities associated with grayscale lithography and 3D etch transfer, which conditions may not be compatible with simultaneously clearing the remaining sacrificial cavity material in a same step. From this point, additional processing steps may be performed similar to those illustrated in FIGS. 2-4 through 2-9 to complete the transducer structure.

Referring now to FIGS. 4-1 through 4-7, there is shown a series of cross-sectional views illustrating an exemplary process flow for forming a micromachined ultrasound transducer device having a curved membrane according to another embodiment. FIG. 4-1 is similar to the embodiment of FIG. 1-1 (showing a CMOS substrate 100, a passivation layer 102 and a patterned bottom electrode 104), and further illustrating an optional processing variation in which additional passivation material may be formed over the patterned bottom electrode 104 followed by planarization so that the passivation layer 102 and the bottom electrode 104 are substantially co-planar. In this manner, a first dielectric layer 106 formed over the passivation layer 102 and patterned bottom electrode 104 may be substantially planar, as illustrated in FIG. 4-2. FIG. 4-2 further illustrates the formation of a patterned sacrificial cavity material layer 108.

Figure 43:
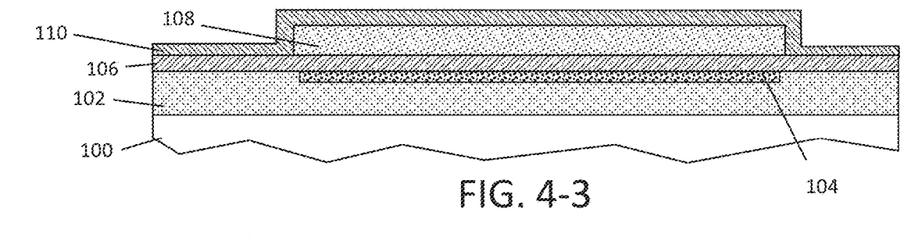
Figure 44:
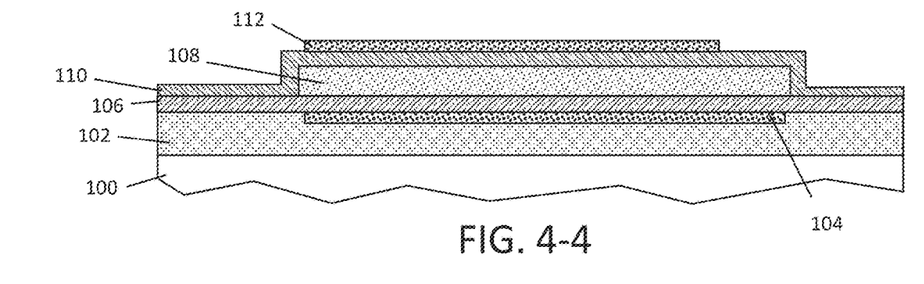

In FIG. 4-3, a second dielectric layer 110 is formed over the first dielectric layer 106 and the patterned sacrificial cavity material layer 108. In one embodiment, second dielectric layer 110 may be formed by plasma enhanced chemical vapor deposition (PECVD) silicon nitride. Then, as shown in FIG. 4-4, a patterned top electrode 112 is formed over the second dielectric layer 110. In an embodiment, the top electrode may be a multiple layer stack including TiN/Al/TiN at a total thickness of about 300 nm. From this point, stress engineering techniques may be used to produce a desired transducer membrane curvature. In particular, film stress in the individual PECVD layers can be tuned to induce a controlled curvature in the membrane by adjusting the recipes of the PECVD process. For example, a plasma excitation source may comprise both "high frequency" and "low frequency" sources, and adjusting the power between these sources can in turn adjust the stress in a silicon nitride film.

In a first embodiment, low stress films may be deposited at a bottom of the transducer membrane, with tensile stress being increased with each subsequent coating. The membrane may be curved after removal of the sacrificial cavity material layer 108. In a second embodiment, low stress films may be deposited for each membrane layer up to the sealing of the cavity. Optionally, the membrane curvature (which may be relatively low at this point) can then be measured, after which a final tensile film is deposited to create the desired membrane curvature.

Figure 45:
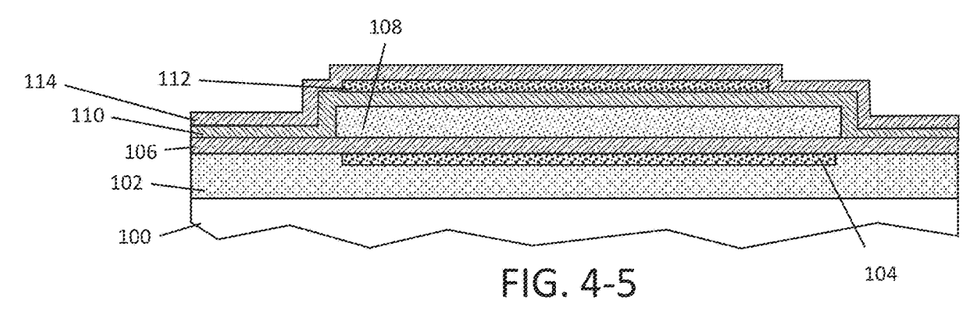

Accordingly, as illustrated in FIG. 4-5, a third dielectric layer 114 is formed over the second dielectric layer 110 and the patterned top electrode 112. For the above mentioned first embodiment, the third dielectric layer 114 may be a PECVD silicon nitride layer formed at a thickness of about 100 nm and having a tensile strength of about 25 MPa. Alternatively, for the above mentioned second embodiment, the third dielectric layer 114 may be a substantially stress-free PECVD silicon nitride layer formed at a thickness of about 100 nm.

Figure 18:
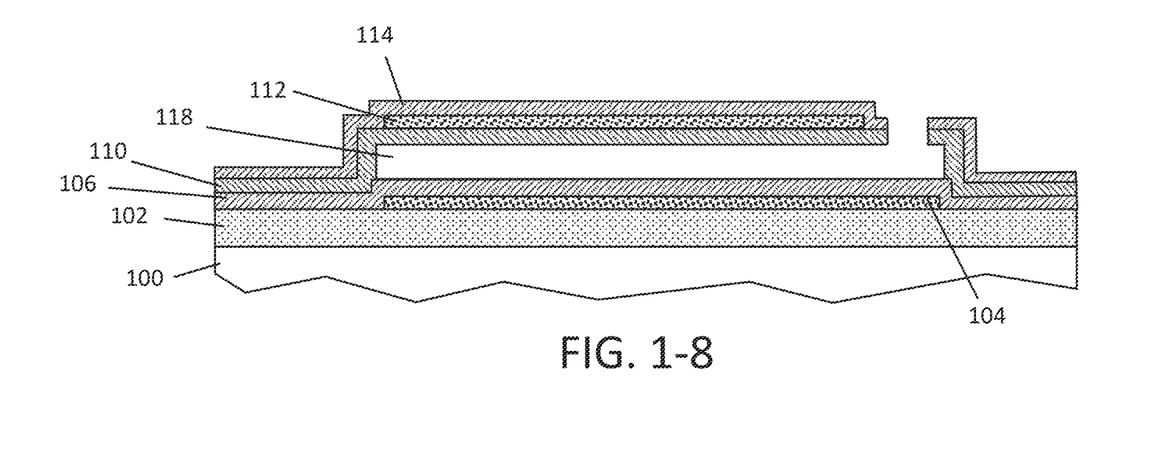
Figure 46:
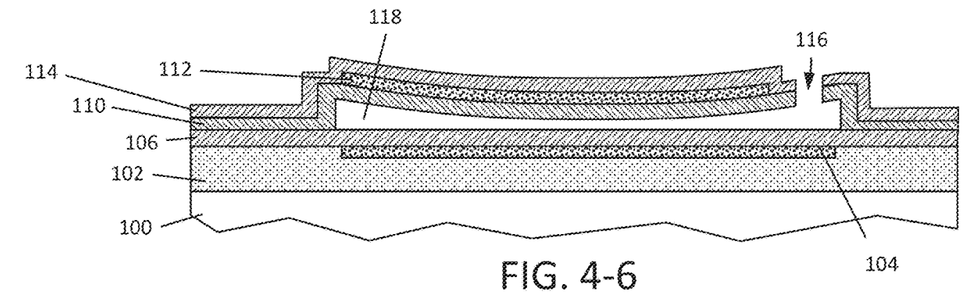
Figure 47:
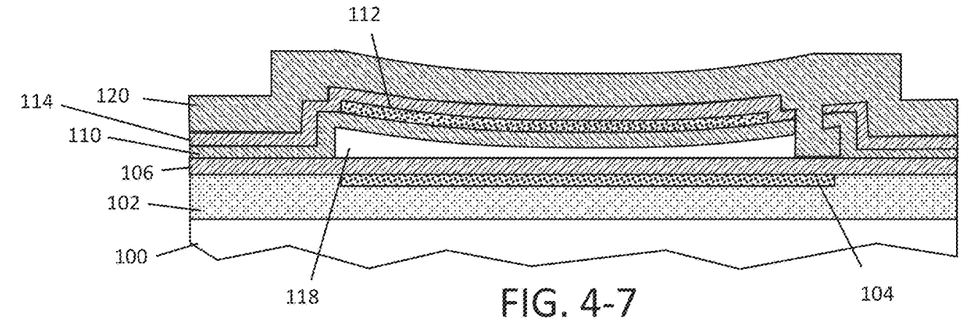

Referring now to FIG. 4-6, an access hole 116 is formed through the third and second dielectric layer 114, 110, such as by etching for example, to access and remove the sacrificial cavity material 108 and to create an ultrasound transducer cavity 118. Where the third dielectric layer 114 is formed as a tensile layer, the resulting structure may assume an initial curvature as shown in FIG. 4-6. Alternatively, if the third dielectric layer 114 is formed substantially stress free, the structure may at this point in processing resemble that illustrated in FIG. 1-8. In either case, FIG. 4-7 then illustrates the formation of a fourth dielectric layer 120 over the structure to seal the cavity 118. Again, the fourth dielectric layer 120 may be formed from the same material as one or more of the previously formed dielectric layers (e.g., PECVD silicon nitride), and at a greater thickness (e.g., about 5000 nm). For the first embodiment, the fourth dielectric layer 120 may have a tensile strength of about 50 MPa. Alternatively, for the second embodiment, the fourth dielectric layer 120 may be formed so as to be substantially stress-free for an initial portion of its thickness (e.g., for about 2000 nm), followed by being deposited at a tensile strength of about 50 MPa for a remaining portion of its thickness (e.g., for about 3000 nm).

Figure 5:
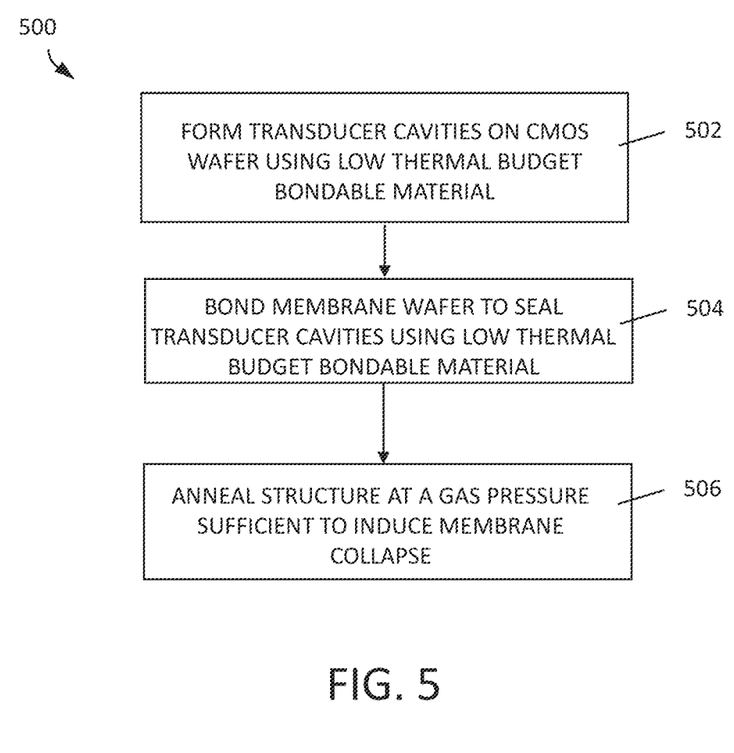
FIG. 5 is a flow diagram illustrating an exemplary process for forming a micromachined ultrasound transducer device having a curved membrane according to another embodiment.

In addition to curved profile sacrificial cavity materials and film stress engineering, still another possible approach to producing a curved membrane structure may be to induce a curvature by pressure after the transducer cavity is sealed. Accordingly, FIG. 5 is a flow diagram illustrating an exemplary process 500 for forming a micromachined ultrasound transducer device having a curved membrane according to another embodiment. In block 502, transducer cavities are formed on a CMOS wafer using a low thermal budget bondable material; that is, using a material where bonding temperatures and times of the material are compatible with other structures on the wafers, such as CMOS devices. An example of the transducer cavity material may be $SiO_2$. In block 504, a membrane wafer is boned to the CMOS wafer in order to seal the transduce cavities. In an embodiment, the membrane wafer may also be $SiO_2$, such that that the bonding operation of the membrane wafer to the CMOS wafer comprises an $SiO_2$ to $SiO_2$ bond. Then, as shown in block 506 of FIG. 5, the bonded structure is subjected to an anneal at a gas pressure that is high enough to induce a curvature of the membrane. For example, the pressure of anneal chamber may be in excess of 100 bar. The time and temperature of the anneal may be sufficient to induce bonding of the membrane to the bottom of the cavity. For example, the anneal may be from about 250° C. to 400° C. for about 1 hour to about 4 hours. The gas may include one or more species with low permeability through the membrane and other structures, such as Ar or $N_2$.

Figure 6:
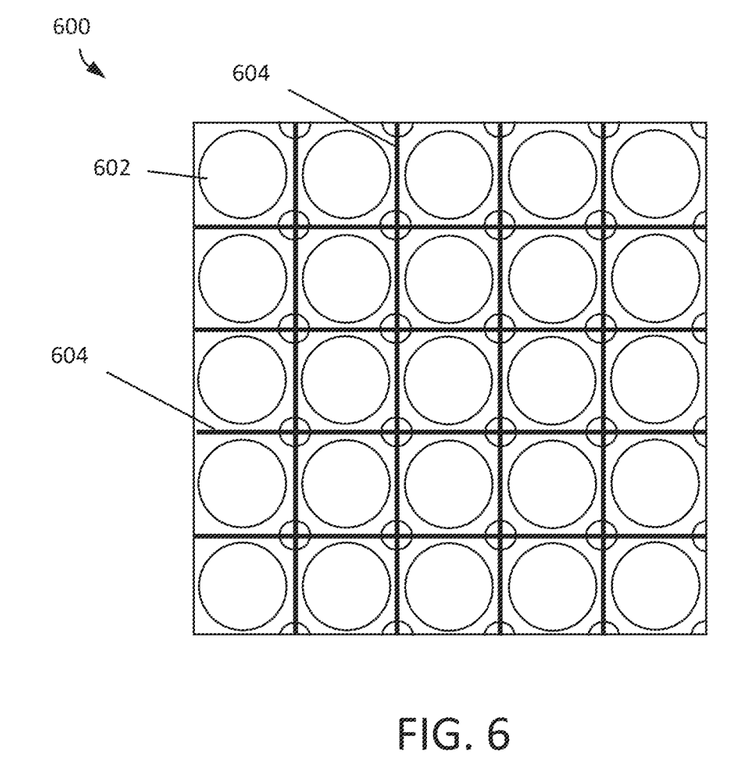
FIG. 6 is a top view of an example ultrasonic transducer device formed using the process flow of FIGS. 2-1 through 2-9, FIGS. 3-1 through 3-3, FIGS. 4-1 through 4-7 and FIG. 5.
Figure 11:
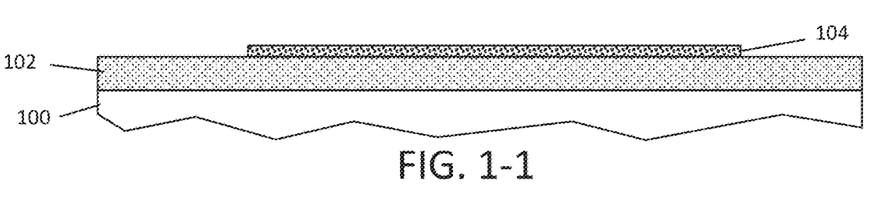

FIG. 6 illustrates a top view of an example ultrasound transducer device 600 formed using any of the process flow sequences described herein. As illustrated, the transducer device includes an array of individual transducers 602, such as those formed by the exemplary processing embodiments described above. It should be appreciated that although the exemplary geometric structure of this portion of the ultrasound transducer 602 is generally circular in shape, other configurations are also contemplated such as for example, rectangular, hexagonal, octagonal, and other multi-sides shapes, etc. The specific number of transducers 602 shown in FIG. 6 should not be construed in any limiting sense, and may include any number suitable for a desired imaging application, which may be for example on the order of tens, hundreds, thousands, tens of thousands or more. FIG. 6 further illustrates an example location of metal 604 that may distribute an electrical signal to the membranes (upper electrodes) of the transducers 602.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of forming an ultrasonic transducer device, the method comprising:
    forming a curved membrane over a transducer cavity, wherein a center portion of the curved membrane is closer to a bottom surface of the transducer cavity than with respect to radially outwardly disposed portions of the curved membrane;
    forming a curved sacrificial cavity material, over a transducer bottom electrode, by chemical mechanical polishing (CMP);
    forming one or more membrane layers over the curved sacrificial cavity material and the transducer bottom electrode;
    removing the sacrificial cavity material to form the curved membrane,
    wherein forming the curved sacrificial cavity material by CMP includes:
        forming a sacrificial cavity material layer and patterning the sacrificial cavity material layer over the transducer bottom electrode;
        forming a dielectric layer over the patterned sacrificial cavity material layer;
        patterning the dielectric layer disposed over the patterned sacrificial layer; and
        performing the CMP on the patterned dielectric layer and patterned sacrificial cavity material layer to induce dishing of the patterned sacrificial cavity material layer such that more sacrificial cavity material layer is removed at a center location than with respect to outer locations.

2. The method of claim 1, wherein
the patterned dielectric layer includes dielectric material that protrudes above a surface of the patterned sacrificial cavity material to induce dishing of the patterned sacrificial cavity material layer during CMP.

3. A method of forming an ultrasonic transducer device, the method comprising:
    forming a curved membrane over a transducer cavity, wherein a center portion of the curved membrane is closer to a bottom surface of the transducer cavity than with respect to radially outwardly disposed portions of the curved membrane;
    forming a curved sacrificial cavity material over a transducer bottom electrode, by grayscale lithography;
    forming one or more membrane layers over the curved sacrificial cavity material and the transducer bottom electrode; and
    removing the sacrificial cavity material to form the curved membrane,
    wherein the grayscale lithography includes:
        forming a sacrificial cavity material layer over the transducer bottom electrode;
        forming a photoresist layer over the sacrificial cavity material layer;
        performing spatially modulated patterning of the photoresist layer to create a curved profile in the patterned photoresist layer;
        developing the patterned photoresist layer so as to form a photoresist structure having the curved profile above the transducer bottom electrode; and
        etching the curved profile of the photoresist structure and the sacrificial cavity material to transfer the curved profile into the sacrificial cavity material layer.

4. The method of claim 3, further comprising:
using a etch recipe selected for a low etch selectivity between the photoresist and the sacrificial cavity material layer.

5. A method of forming an ultrasonic transducer device, the method comprising:
    forming a curved membrane over a transducer cavity, wherein a center portion of the curved membrane is closer to a bottom surface of the transducer cavity than with respect to radially outwardly disposed portions of the curved membrane,
    wherein forming the curved membrane includes:
        forming the transducer cavity on a CMOS wafer;
        bonding a membrane wafer to the CMOS wafer to seal the transducer cavity; and
        performing an anneal to collapse the bonded membrane wafer into the transducer cavity and induce a curvature in the membrane wafer.

6. The method of claim 5, further comprising:
patterning layers in the membrane wafer to induce film stress that biases the membrane wafer to curve toward the transducer cavity.

7. The method of claim 5, wherein
after bonding the membrane wafer, a gas is pressurized on an exterior of the transducer cavity such that the annealing is performed at a gas pressure that induces the membrane wafer to collapse into the transducer cavity.

* * * * *